(12) United States Patent
Gilliland

(10) Patent No.: US 7,295,048 B2
(45) Date of Patent: Nov. 13, 2007

(54) METHOD AND APPARATUS FOR GENERATING SPREAD SPECTRUM CLOCK SIGNALS HAVING HARMONIC EMISSION SUPPRESSIONS

(75) Inventor: Don A. Gilliland, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/232,749

(22) Filed: Sep. 22, 2005

(65) Prior Publication Data

US 2007/0063755 A1    Mar. 22, 2007

(51) Int. Cl.
*H03B 19/00*    (2006.01)
(52) U.S. Cl. ....................... 327/122; 327/119
(58) Field of Classification Search ................ 327/113, 327/114, 164, 261, 263, 122, 119
See application file for complete search history.

(56) References Cited

U.S. PATENT DOCUMENTS

| | | | | |
|---|---|---|---|---|
| 5,534,803 | A * | 7/1996 | Correale et al. | 327/108 |
| 5,721,501 | A * | 2/1998 | Toyoda et al. | 327/116 |
| 6,441,659 | B1 * | 8/2002 | Demone | 327/156 |
| 6,943,599 | B2 * | 9/2005 | Ngo | 327/156 |
| 7,123,063 | B2 * | 10/2006 | Lutkemeyer | 327/149 |

* cited by examiner

*Primary Examiner*—Dinh T. Le
(74) *Attorney, Agent, or Firm*—Dillon & Yudell LLP

(57) ABSTRACT

A method for generating spread spectrum clock signals having harmonic emission suppressions is disclosed. A set of delayed clock signals is initially generated by delaying a high-speed clock signal via a set of delay modules. Then, the leading edge of a first one of the delayed clock signals is selectively combined with a trailing edge of any one of the delayed clock signals to form a half-period spread spectrum clock signal having low harmonic emissions.

2 Claims, 2 Drawing Sheets

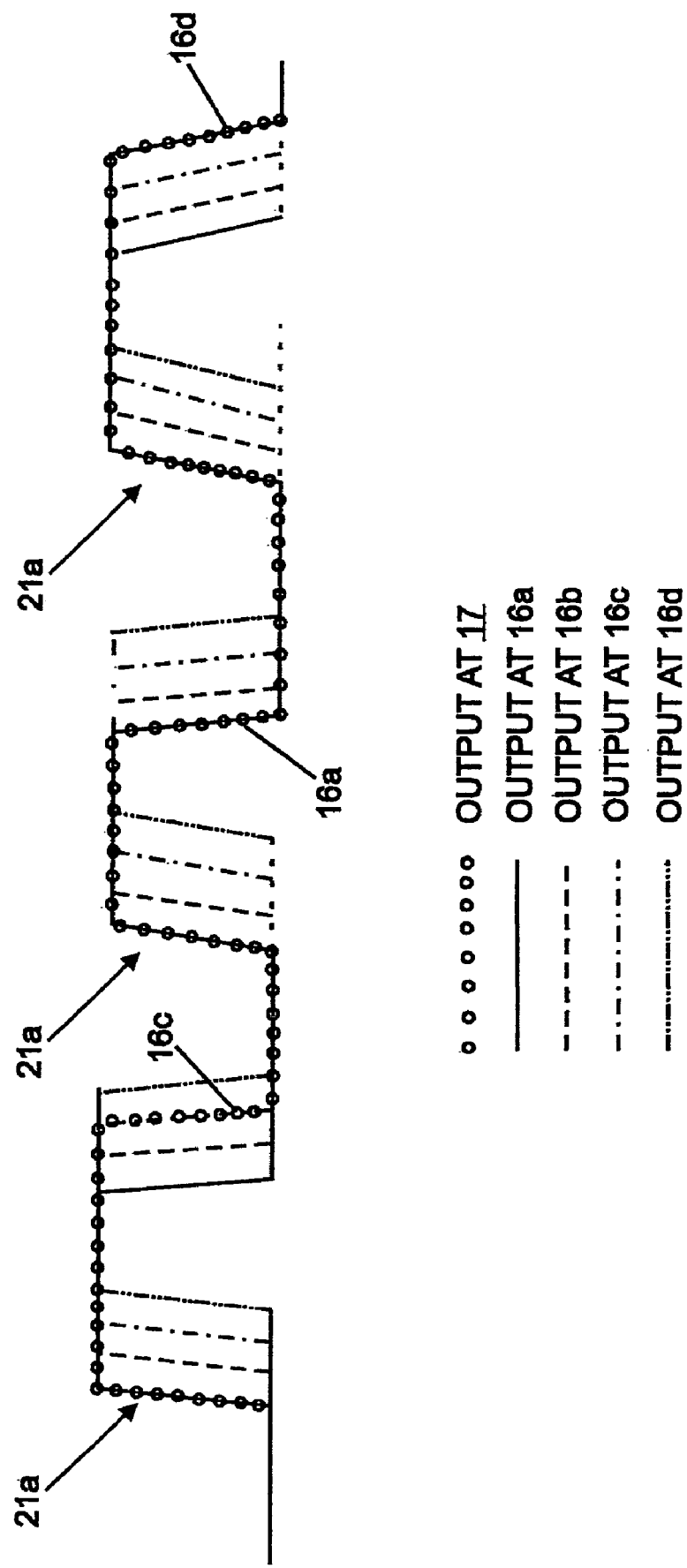

METHOD AND APPARATUS FOR GENERATING SPREAD SPECTRUM CLOCK SIGNALS HAVING HARMONIC EMISSION SUPPRESSIONS

BACKGROUND OF THE INVENTION

1. Technical Field

The present invention relates to clock generation in general, and, in particular, to a method and apparatus for generating spread spectrum clock signals. Still more particularly, the present invention relates to a method and apparatus for generating half-period spread spectrum clock signals having harmonic emission suppressions.

2. Description of Related Art

Many electronic devices employ processors and/or other digital circuits that require clock signals for synchronization. Clock signals can be generated by a free-running oscillator driven by a crystal, an LC-tuned circuit, or an external clock source. Parameters of a clock signal may include maximum and minimum allowable clock frequencies, tolerances on high and low voltage levels, maximum rise and fall times on waveform edges, pulse-width tolerance for a non-square wave, and the timing relationship between clock phases if two-clock phase signals are needed.

High-speed electronic circuits are particularly susceptible to generating and radiating electromagnetic interference (EMI). Accordingly, many regulatory agencies, such as the Federal Communication Commission (FCC) and the Comite International Special Des Perturbations Radioelectriques (CISPR), have established maximum allowable EMI emission standards for electronic equipments, and promulgate guidelines concerning measurement equipment and techniques for determining EMI compliance.

The spectral components of the EMI emissions typically have peak amplitudes at harmonics of the fundamental frequency of a clock circuit. In order to comply with the above-mentioned governmental limits on EMI emissions, costly suppression measures or extensive shielding can be utilized. Other approaches for reducing EMI emissions include careful routing of signal traces on printed circuit boards to minimize loops and other potentially radiating structures. However, EMI emissions are made worse at higher clock speeds.

Consequently, it would be desirable to provide an improved method and apparatus for generating high-speed clock signals having relatively low EMI emissions.

SUMMARY OF THE INVENTION

In accordance with a preferred embodiment of the present invention, a set of delayed clock signals is initially generated by delaying a high-speed clock signal via a set of delay modules. Then, the leading edge of a first one of the delayed clock signals is selectively combined with a trailing edge of any one of the delayed clock signals to form a half-period spread spectrum clock signal having low harmonic emissions.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 2 depicts waveforms of an output spread spectrum clock signal in relation to other delayed clock signals, in accordance with a preferred embodiment of the present invention.

DETAILED DESCRIPTION OF A PREFERRED EMBODIMENT

Figure 1:
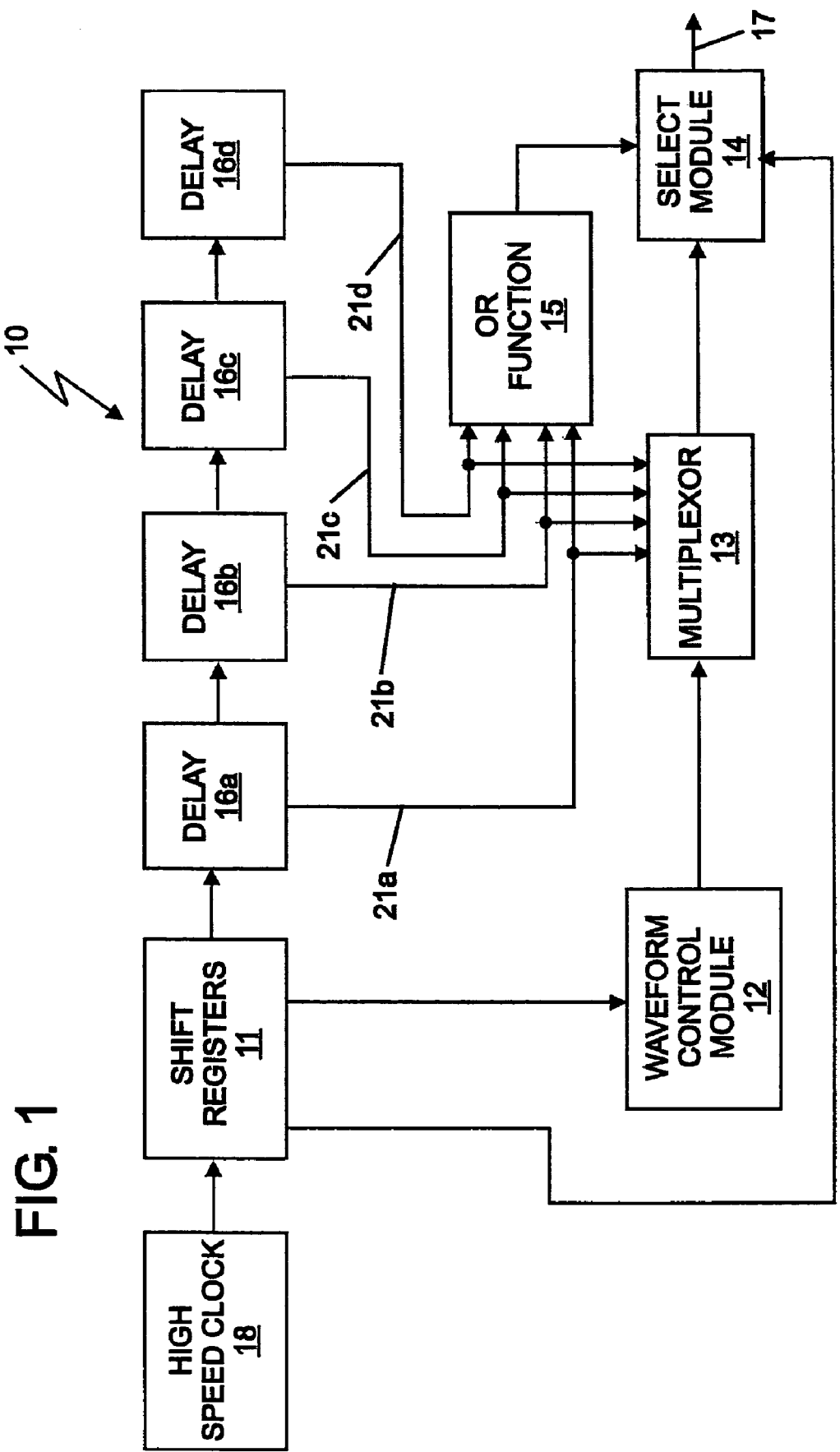
FIG. 1 is a block diagram of an apparatus for generating spread spectrum clock signals, in accordance with a preferred embodiment of the present invention.

Referring now to the drawings and in particular to FIG. 1, there is depicted a block diagram of an apparatus for generating spread spectrum clock signals, in accordance with a preferred embodiment of the present invention. As shown, a clock generation circuit 10 includes shift registers 11, a waveform control module 12, a multiplexer 13, a select module 14, an OR function module 15, and delay modules 16a-16d. Shift registers 11 sends a high-speed clock signal generated by a high-speed clock 18 to waveform control module 12, delay module 16a, and select module 14. The high-speed clock signal continues to propagate through delay module 16a-16d to form delayed clock signals 21a-21d, respectively. Delayed clock signals 21a-21d are fed to multiplexer 13 and to OR function module 15. Select module 14 combines the output from OR function module 15 and the output from multiplexer 13 to provide a half-period spread spectrum clock signal at an output 17.

OR function module 15 establishes a leading edge of a half-period spread spectrum clock signal, and multiplexer 13 provides a trailing edge of the half-period spread spectrum clock signal. After the selection of the leading edge of the half-period spread spectrum waveform, the trailing edge is selected and switched in to complete the half cycle of the spread spectrum clock signal.

The leading edge of a half-period spread spectrum clock signal always comes from the leading edge of the first delayed clock signal, and the trailing edge of the half-period spread spectrum clock signal may come from the trailing edge of any of the delayed clock signals. For the present embodiment, the first delayed clock signal is delayed clock signal 21a that comes from the output of delay module 16a, and the trailing edge of the half-period spread spectrum clock signal may come from the trailing edge of any of delayed clock signals 21a-21d from the outputs of delay modules 16a-16d, respectively.

For example, the leading edge of a half-period spread spectrum clock signal is from delayed clock signal 21a at the output of delay module 16a, the trailing edge is from delayed clock signal 21c at the output of delay module 16c, then the next leading edge of the half-period spread spectrum clock signal is from delayed clock signal 21a at the output of delay module 16a, the next trailing edge is from delayed clock signal 21b at the output of delay module 16b, and so on.

By selectively choosing one of four delayed clock signals 21a-21d at the outputs of delay modules 16a-16d, respectively, to be used as the trailing edge of the half-period spread spectrum clock signal, multiplexer 13 controls the spread deviation and shape of the spread spectrum clock signal at output 17.

With reference now to FIG. 2, there are depicted waveforms of an output spread spectrum clock signal in relation to other delayed clock signals, in accordance with a preferred embodiment of the present invention. As shown, the leading edge of a spread spectrum clock signal always comes from delayed clock signal 21a at the output of delay module 16a, and the trailing edge can come from the delayed clock signal at the output of any of delay modules 16a-16d. In the example shown in FIG. 2, the first trailing edge comes from delayed clock signal 21c at the output of delay module 16c, the second trailing edge comes from delayed clock signal 21a at the output of delay module 16a, and the third trailing edge comes from delayed clock signal 21d at the output of delay module 16d.

As has been described, the present invention provides an improved method and apparatus for generating spread spectrum clock signals having harmonic emission suppressions. The harmonic spread spectrum clock signals of the present invention are generated by a series of precision delay modules. The half-cycle of the harmonic spread spectrum clock is incrementally changed in a manner that reduces the time spent at the extremes of the deviation. Although only four delay modules are utilized to illustrated the principle of the present invention, it is understood by those skilled in the art that any number delay modules can be used.

The leading edges of the half-period spread spectrum clock signals of the present invention retain their positions. In contrast, the leading edge or period of conventional spread spectrum clock signals change continuously. With the present invention, the period of a spread spectrum clock signal does not change but its pulse width does. Having the period of a clock signal remain the same allows basic input/output communications to be performed normally without increasing the length of a buffer in order to account for a full spread spectrum.

While the invention has been particularly shown and described with reference to a preferred embodiment, it will be understood by those skilled in the art that various changes in form and detail may be made therein without departing from the spirit and scope of the invention.

What is claimed is:

1. An apparatus for generating a half-period spread spectrum clock signal having harmonic emission suppressions, said apparatus comprising:
    a plurality of delay modules for generating a plurality of delayed clock signals by delaying a clock signal;
    a waveform control module and a multiplexor coupled to said plurality of delay modules; and
    a select module coupled to said waveform control module and said multiplexor for generating a half-period spread spectrum clock signal by combining a leading edge of a time delayed clock signal from one of said plurality of delayed modules and a trailing edge of a time delayed clock signal from any other one of said plurality of delayed modules.

2. The apparatus of claim 1, wherein said one of said plurality of delay modules is a first one of said plurality of delayed modules.

* * * * *